ary Examiner—Gil Weidenfeld
United States Patent [19]

Gliha, Jr.

[11] Patent Number: 4,583,810
[45] Date of Patent: Apr. 22, 1986

[54] HERMETICALLY SEALED FILTER CONNECTOR

[75] Inventor: Edward R. Gliha, Jr., Bainbridge, N.Y.

[73] Assignee: Allied Corporation, Morris Township, Morris County, N.J.

[21] Appl. No.: 610,070

[22] Filed: May 14, 1984

[51] Int. Cl.⁴ .............................................. H03H 7/00
[52] U.S. Cl. .................................. 339/147 R; 333/185
[58] Field of Search ........... 339/143 R, 147 R, 147 P; 333/181–185

[56] References Cited

U.S. PATENT DOCUMENTS

| | | | |
|---|---|---|---|
| 3,462,715 | 8/1969 | Schor | 339/147 R |
| 3,482,201 | 12/1969 | Schneck | 339/14 |
| 3,522,575 | 8/1970 | Watson et al. | 339/89 |
| 3,560,908 | 2/1971 | Dell et al. | 339/91 |
| 3,629,785 | 12/1971 | Cowmeadow | 339/14 R |
| 3,790,858 | 2/1974 | Brancaleone et al. | 339/147 P |
| 3,992,652 | 11/1976 | Blaisdell et al. | 339/14 R |
| 4,211,461 | 7/1980 | Wescott | 339/91 |
| 4,420,210 | 12/1983 | Karol et al. | 339/94 M |
| 4,458,220 | 7/1984 | Carter et al. | 339/147 R |

*Primary Examiner*—Gil Weidenfeld
*Assistant Examiner*—Gary F. Paumen
*Attorney, Agent, or Firm*—Anibal Jose Cortina; Roger H. Criss

[57] ABSTRACT

This invention relates to electrical connectors used between bulkheads and more specifically to a hermetically sealed connector having a removably mounted electrical filter assembly (10). The connector is characterized by a metal connector shell (1) having a plurality of electrical contacts (2) hermetically sealed (3) and mounted within the shell (1), and an electrical filter assembly (10) removably mounted (4, 5a, 11) and electrically connected to at least one of the contacts (2) and shell (1).

10 Claims, 6 Drawing Figures

HERMETICALLY SEALED FILTER CONNECTOR

BACKGROUND OF THE INVENTION

This invention relates to electrical connectors used between bulkheads and more specifically to a hermetically sealed connector having a removably mounted electrical filter assembly.

Electrical connectors having a circuit for filtering out unwanted electrical signals are used in electronic systems where it is necessary to eliminate unwanted electromagnetic interference. Typically, a filter type electrical connector comprises a pair of separable connector shells having multiple pairs of mating contacts, with one of the connector shells having one or more filter contact assemblies. Filter contact assemblies are fragile so they are mounted within the connector shell for protection. In applications where the connector shell is used between bulkheads, it is necessary that the connector have a hermetic seal to prevent moisture or other adverse environments from passing through the bulkheads via the connector. One example of such a connector may be found in U.S. Pat. No. 4,420,210 issued Dec. 13, 1983 and entitled "Hermetic Through Bulkhead Electrical Connector". The hermetic seal presents a problem because the filter portion of a connector assembly is easily affected adversely by heat, and heat is necessary to fabricate a hermetic seal between the contacts and connector shell. Accordingly, there is a high rejection rate of hermetic connectors because of filter assemblies adversely affected by the heat present during the making of a hermetic seal. Further, in situations where a connector utilizes both filter and unfiltered contacts and a filter contact fails, it is necessary to replace the entire connector. These factors increase the cost of a hermetic filter type electrical connector.

SUMMARY OF THE INVENTION

This invention provides a hermetically sealed filter type electrical connector wherein the filter assembly portion of the connector is removably mounted after the hermetic seal is fabricated. The connector is characterized by a metal connector shell having a plurality of electrical contacts hermetically sealed and mounted within the shell and means for removably mounting and electrically connecting an electrical filter assembly to at least one of the contacts and the shell.

Accordingly, it is an advantage of this invention to provide a hermetically sealed electrical connector that has a removably mounted electrical filter assembly.

Another advantage of this invention is that it provides a hermetically sealed filter connector having an easily repairable or replaceable filter contact assembly.

Another advantage of this invention is that it eliminates the need to replace an entire connector when only the electrical filter circuit portion of the connector fails.

BRIEF DESCRIPTION OF THE INVENTION

DETAILED DISCUSSION OF THE INVENTION

Figure 1:
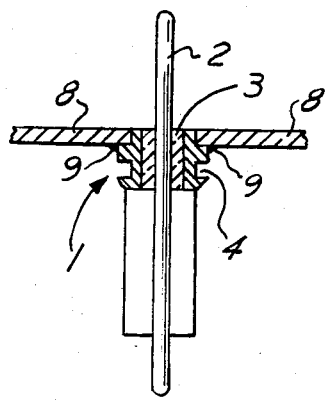
FIG. 1 is a cross-sectional view of the hermetically sealed portion of an electrical connector.

Referring now to the drawings, FIG. 1 illustrates a cross-sectional view of an electrical contact 2 hermetically sealed within a connector shell 1. The metal shell 1 includes a groove 4 on the outside thereof and one or more contacts 2 each hermetically sealed within the shell 1 by a fused glass 3. The shell 1 may be soldered or welded 9 to a bulkhead 8 so that the weld 9 and hermetic seal 3 of the connector prevent the environment on one side of the bulkhead 8 from passing through the connector to the other side of the bulkhead.

Figure 2:
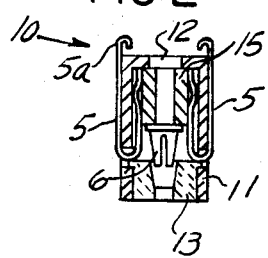
FIG. 2 is a cross-sectional view of the removable filter assembly portion of an electrical connector.

FIG. 2 illustrates an electrical filter assembly 10 which comprises a metal housing 11 having at least one passage 12 adapted to receive a respective contact; an epoxy insert 13 having at least one passage adapted to receive a respective contact; a capacitive circuit element 15 having at least one passage through which a respective contact passes; a metal sleeve 6; and a U-shaped metal spring 5 having a resiliently deflectable latch 5a at one end that is adapted to engage the groove 4 in the connector shell 1 shown in FIG. 1. The other end of the spring member 5 is electrically connected to one terminal of the capacitive element 15. The other terminal of the capacitive element 15 is electrically connected to a metal sleeve 6. The metal sleeve 6 includes a slot or slit so that it is expanded by insertion of a contact through the sleeve 6.

Figure 3:
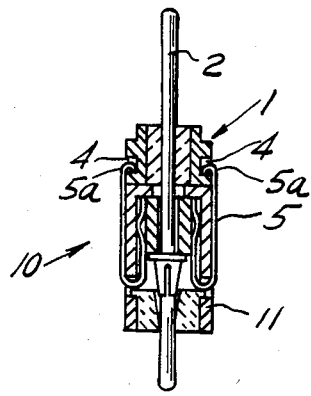
FIG. 3 is a cross sectional view of the hermetically sealed contacts and filter assembly electrically and mechanically connected together.

FIG. 3 is a cross-sectional view of a hermetically sealed electrical connector and illustrates the electrical filter assembly 10 shown in FIG. 2 connected to the hermetically sealed contact 2 and connector shell 1 shown in FIG. 1. The resiliently deflectable latch at one end 5a of the spring 5 engages the groove 4 in the connector shell 1 to mechanically and electrically connect the filter assembly 10 to the connector shell 1. To disconnect the filter assembly 10 from the connector shell 1, the latch end 5a of spring 5 is deflected out of the groove 4 and the filter assembly is moved axially away from the shell 1 and contact 2. One terminal of the capacitive circuit element 15 is electrically connected to the contact 2 by metal sleeve 6. The other terminal of said capacitive circuit element 15 is electrically connected to said metal shell 1 by said metal spring 5. The terminals of said capacitive circuit element 15 generally being conductive coatings at predetermined locations on the surface of said element 15.

Figure 4:
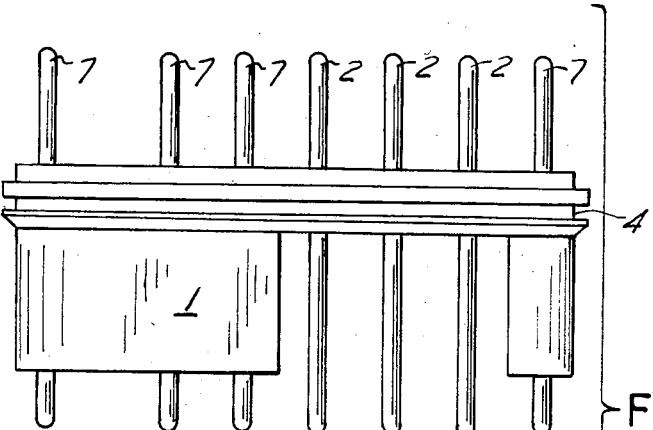
FIG. 4 is a side view of an electrical connector with the filter assembly disconnected from the connector.

FIG. 4 illustrates a side view of an electrical connector with the filter assembly 10 disconnected from the connector shell 1. Since many applications require both filtered contacts 2 and unfiltered contacts 7, the preferred embodiment includes some contacts 2 that have the capability of filtering out unwanted electrical signals when the filter assembly 10 is connected to the connector shell 1 by the latches 5a. When the filter assembly 10 is connected to the shell, unwanted electrical signals are filtered out through the metal spring 5 and housing 1.

Figure 5:
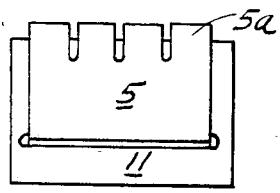
FIG. 5 is a bottom view of the connector assembly shown in FIG. 4.
Figure 5:
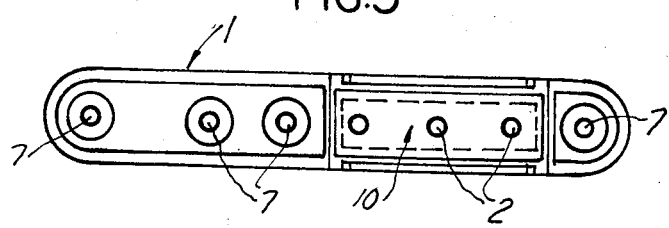

FIG. 5 illustrates a bottom view of the connector shown in FIG. 4.

Figure 6:
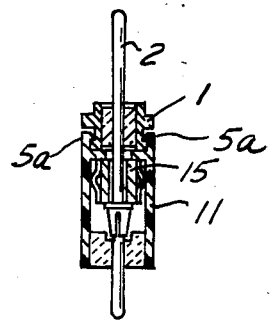
FIG. 6 is an alternate embodiment of the removable filter assembly.

FIG. 6 is an alternate embodiment of the filter assembly 10 shown in FIG. 2 wherein the latch for releasably retaining the filter assembly 10 to the connector shell 1 is an integral part of the housing 11 of the filter assembly 10. In this embodiment, the housing is a molded plastic with an electrically conductive plating. The resiliently deflectable latch 5a, that mates with the groove 4 in the shell 1, being an integral part of the housing 11. Similarly, by deflecting the latch 5a of the housing 11 away from the groove 4 in shell 1, the housing 11 may be moved axially away from the shell 1. In this embodiment, one terminal of the capacitive element 15 is electrically connected to the metal shell by the conductive plating in the housing 11.

Having described the invention what is claimed is:

1. In combination with a hermetically sealed filter connector of the type having a metal shell; at least one electrical contact; means mounting each of said at least one contacts in said metal shell, including a hermetic seal between the shell and each of said at least one contacts; and means for electrically filtering unwanted signals from at least one of said at least one contacts, the improvement wherein said filtering means comprises:

a housing, having at least one passage through which a respective one of said at least one contacts passes;

a capacitive circuit element for each passage in said housing, each capacitive element mounted in said housing and having a passage through which a respective one of said at least one contacts passes; and means removably mounted said housing to said metal shell and for electrically connecting one terminal of each capacitive element in electrical connection with said metal shell and the other terminal of each capacitive element in electrical connection with a respective one of said at least one contacts.

2. The hermetically sealed filter connector as described in claim 1 wherein the means removably mounting said housing to said metal shell includes:

a groove in said metal shell; and a member connected to the housing, said member having a resiliently deflectable latch engaging the groove in said metal shell.

3. The hermetically sealed filter connector as described in claim 1 wherein said means for electrically connecting the one terminal of the capacitive element to the shell comprises:

a U-shaped metal spring member having one end that engages one terminal of said capacitive circuit element and another end that engages the groove in the metal shell, said end engaging the groove being resiliently deflectable to permit disengagement of the end from the groove in the shell and allow removal of said filtering means housing from said connector shell.

4. The hermetically sealed filter connector as recited in claim 2 wherein there are at least two latches, each latch located opposite of and facing the other latch.

5. The hermetically sealed filter connector as recited in claim 3 wherein there are at least two spring members, each spring member having its deflectable end located opposite of and facing the deflectable end of the other spring member.

6. The hermetically sealed filter connector as described in claim 1 further including:

an insert mounted in one end of said housing, said insert having the same number of passages as there are passages in said housing through which respective contacts pass.

7. The hermetically sealed filter connector as described in claim 2 further characterized by:

an insert mounted in one end of said housing, said insert having the same number of passages as there are passages in said housing through which respective contacts pass.

8. The hermetically sealed filter connector as described in claim 3 further characterized by:

an insert mounted in one end of said housing, said insert having the same number of passages as there are passages in said housing through which respective contacts pass.

9. The hermetically sealed filter connector as described in claim 4 further characterized by:

an insert mounted in one end of said housing, said insert having the same number of passages as there are passages in said housing through which respective contacts pass.

10. The hermetically sealed filter connector as described in claim 5 further characterized by:

an insert mounted in one end of said housing, said insert having the same number of passages as there are passages in said housing through which respective contacts pass.

* * * * *